(12) United States Patent
Park

(10) Patent No.: US 7,937,676 B2
(45) Date of Patent: *May 3, 2011

(54) METHOD OF ARRANGING MASK PATTERNS AND APPARATUS USING THE METHOD

(75) Inventor: Dong-Woon Park, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 780 days.

This patent is subject to a terminal disclaimer.

(21) Appl. No.: 11/937,317

(22) Filed: Nov. 8, 2007

(65) Prior Publication Data

US 2008/0138720 A1 Jun. 12, 2008

(30) Foreign Application Priority Data

Dec. 12, 2006 (KR) ........................ 10-2006-0126379

(51) Int. Cl.
*G06F 17/50* (2006.01)
(52) U.S. Cl. ................. 716/55; 716/50; 716/51; 716/52; 716/53; 716/54; 430/5; 430/30
(58) Field of Classification Search ............... 716/19–21, 716/50–55; 430/5, 30
See application file for complete search history.

(56) References Cited

U.S. PATENT DOCUMENTS

| 7,487,489 B2* | 2/2009 | Granik ........................... 716/19 |
| 7,620,930 B2 | 11/2009 | Van Den Broeke et al. |
| 7,721,246 B2* | 5/2010 | Li et al. ........................... 716/19 |
| 2005/0142470 A1 | 6/2005 | Socha et al. |
| 2006/0075377 A1 | 4/2006 | Broeke et al. |
| 2006/0147815 A1 | 7/2006 | Melvin, III et al. |
| 2006/0188673 A1 | 8/2006 | Melvin, III et al. |
| 2006/0236296 A1 | 10/2006 | Melvin, III et al. |
| 2006/0250589 A1 | 11/2006 | Eurlings et al. |
| 2008/0301620 A1 | 12/2008 | Ye et al. |

FOREIGN PATENT DOCUMENTS

| KR | 20050041958 | 5/2005 |
| KR | 2005-0069518 | 7/2005 |
| KR | 20060050603 | 5/2006 |

OTHER PUBLICATIONS

Li, et al., Rapid search of the Optimum placement of assist feature to improve the aerial image gradient in iso-line structure, 2007, SPIE, pp. 1-7.*

English language abstract of Korean Publication No. 2005-0069518.

* cited by examiner

*Primary Examiner* — Nghia M Doan
(74) *Attorney, Agent, or Firm* — Muir Patent Consulting, PLLC

(57) ABSTRACT

In positioning assist features on a photomask pattern to improve the image quality of the main features, the method includes deriving an h-function in a first process which represents a contribution of an assist feature with respect to image intensity at a main feature. In a continuation of the method, the position of the assist features are determined in a second process using the h-function derived in the first step. The assist features are then formed on the mask at the positions indicated. Also included is a computer readable medium having instructions for performing the h-function calculations, and the mask apparatus itself with both main and assist features positioned according to the h-function.

22 Claims, 6 Drawing Sheets

FIG. 2

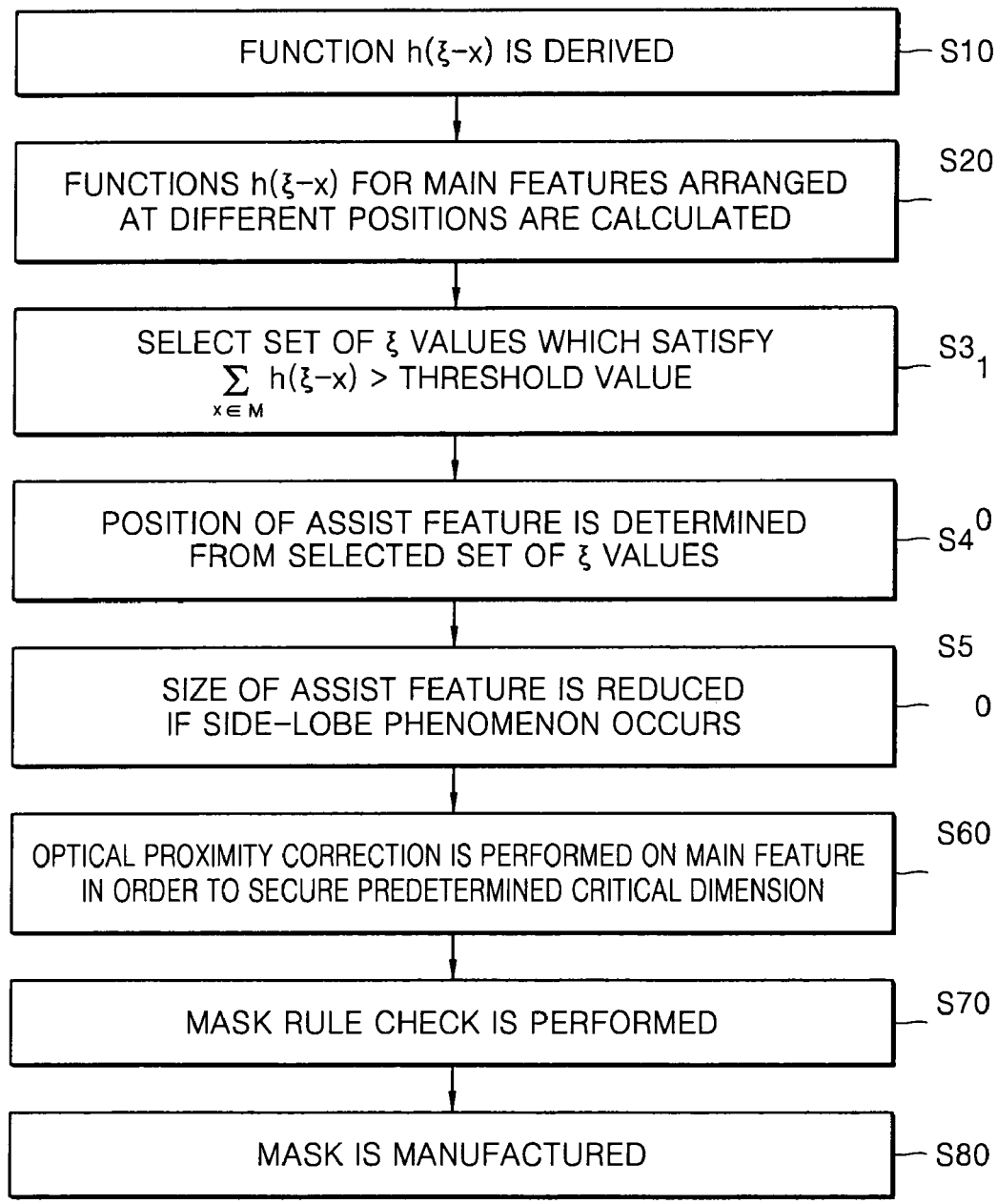

- S10 FUNCTION $h(\xi-x)$ IS DERIVED
- S20 FUNCTIONS $h(\xi-x)$ FOR MAIN FEATURES ARRANGED AT DIFFERENT POSITIONS ARE CALCULATED
- S31 SELECT SET OF $\xi$ VALUES WHICH SATISFY $\sum_{x \in M} h(\xi-x) >$ THRESHOLD VALUE
- S40 POSITION OF ASSIST FEATURE IS DETERMINED FROM SELECTED SET OF $\xi$ VALUES
- S50 SIZE OF ASSIST FEATURE IS REDUCED IF SIDE-LOBE PHENOMENON OCCURS
- S60 OPTICAL PROXIMITY CORRECTION IS PERFORMED ON MAIN FEATURE IN ORDER TO SECURE PREDETERMINED CRITICAL DIMENSION
- S70 MASK RULE CHECK IS PERFORMED
- S80 MASK IS MANUFACTURED

METHOD OF ARRANGING MASK PATTERNS AND APPARATUS USING THE METHOD

CROSS-REFERENCE TO RELATED PATENT APPLICATION

This application claims the priority of Korean Patent Application No. 10-2006-0126379, filed on Dec. 12, 2006, in the Korean Intellectual Property Office, the disclosure of which is incorporated herein in its entirety by reference.

BACKGROUND OF THE INVENTION

1. Field of the Invention

The present invention relates to a method of fabricating a semiconductor and an apparatus using the method, and more particularly, to a method of arranging assist features within mask patterns and an apparatus using the method.

2. Description of the Related Art

One of the goals in integrated circuit fabrication is to faithfully reproduce the original circuit design on a semiconductor wafer via a mask using as much area of the semiconductor wafer as possible. Another goal is to optimize exposure and improve image intensity on the semiconductor wafer. Yet another goal is to increase depth of focus (DOF) and exposure latitude (EL). However, the microscopic size of main features makes it difficult for light to pass through holes or lines on the mask. Consequently, the DOF and the EL are reduced.

Conventional methods suggested in order to solve this problem include a method of arranging assist features on a mask such that light intensity on a feature to be generated can be increased (which, in turn, will increase DOF and EL). Currently, the assist features are arranged by an engineer through trial and error in accordance with the engineer's ability and skill such that a large amount of time is required. Furthermore, the assist features cannot be arranged on a broad area of the mask in consideration of the overall pattern of the mask. Finally, if the mask has various patterns thereon, stable generation of the assist features cannot be guaranteed.

Therefore, a new method of determining optimal positions of the assist features is required.

SUMMARY OF THE INVENTION

The present invention provides a method of determining an optimal position of an assist feature on a mask.

The present invention also provides a computer readable recording medium having recorded thereon a computer program for executing a method of determining an optimal position of an assist feature.

The present invention also provides a mask including assist features arranged at an optimal position of the mask.

According to an aspect of the present invention, there is provided a method of arranging mask patterns, the method including a first process of obtaining an h-function which represents a contribution of an assist feature with respect to image intensity at a main feature; and a second process of determining the position of the assist feature using the h-function.

The h-function may be determined by:

$$\frac{I(x) - I_0(x)}{2\sqrt{I_0(x)}} = h(\xi - x)m(\xi)\Delta\xi,$$

where x indicates the position of the main feature, $\xi$ indicates the position of the assist feature, $I(x)$ indicates image intensity at the main feature when the assist feature exists, $I_0(x)$ indicates image intensity at the main feature when the assist feature does not exist, and $m(\xi)$ indicates transmittance of a mask.

The first process may be obtaining the h-function for each of a plurality of main features arranged at different positions on a mask.

The second process may determine the position of the assist feature from a set of $\xi$ values which maximize:

$$\sum_{x \in M} I(x).$$

Alternately, the second process may determine the position of the assist feature from a set of $\xi$ values which makes the value satisfying:

$$\sum_{x \in M} h(\xi - x),$$

equal to or greater than a predetermined threshold value.

As a further alternate, the second process may determine the position of the assist feature from a set of $\xi$ values which satisfy a condition that a linear combination of the maximum and the minimum of the function $h(\xi-x)$ is equal to or greater than a predetermined threshold value.

The method may further include a third process if a side lobe phenomenon occurs in which the assist feature is printed on a semiconductor wafer, where the size of the assist feature is reduced after the second process.

The method may further include a fourth process of performing an optical proximity correction (OPC) to the main feature after the second process in order to implement a predetermined critical dimension.

The method may further include a fifth process of performing a mask rule check after the second process in order to enhance the performance of the mask.

According to another aspect of the present invention, there is provided a computer readable recording medium having recorded thereon a computer program for executing a method of determining an optimal position of an assist feature, the method including a first process of obtaining an h-function which represents a contribution of an assist feature with respect to image intensity at a main feature; and a second process of determining the position of the assist feature using the h-function.

According to another aspect of the present invention, there is provided a mask including a main feature; and an assist feature, wherein the position of the assist feature is determined using an h-function which represents the contribution of the assist feature with respect to the image intensity at the main feature.

By applying the method described above to fabricate semiconductor devices, depth of focus (DOF) of the semiconductor devices is kept uniform and a contact critical dimension is reduced 18% from 140 nm to 115 nm. That is, mask patterns can be implemented more precisely without a loss of DOF.

BRIEF DESCRIPTION OF THE DRAWINGS

The above and other features and advantages of the present invention will become more apparent by describing in detail exemplary embodiments thereof with reference to the attached drawings in which:

FIGS. 1 through 3 are flowcharts illustrating methods of arranging mask patterns according to embodiments of the present invention;

DETAILED DESCRIPTION OF THE INVENTION

Figure 1:
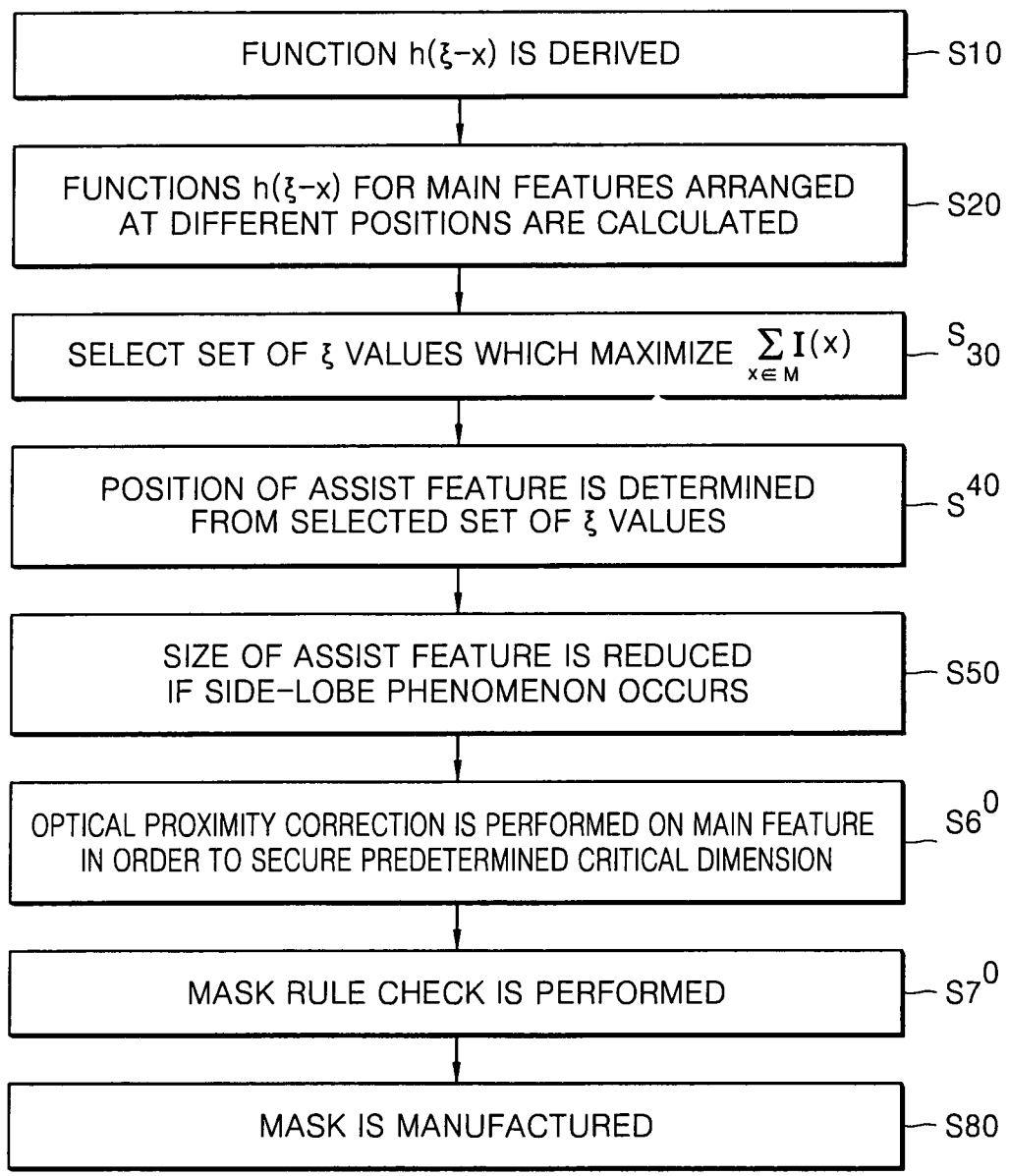

Hereinafter, the present invention will be described in detail by explaining embodiments of the invention with reference to the attached drawings.

The present invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote like elements, and thus their description will not be repeated. It will also be understood that when an element, such as a layer, a region or a substrate, is referred to as being "on" another element, it can be directly on the other element, or intervening elements may also be present.

Spatially relative terms, such as "lower," "bottom," "upper," "top," and the like, may be used herein for ease of description to describe one element's relationship to another element(s) as illustrated in the drawings. It will be understood that the spatially relative terms are intended to encompass different orientations of a device in use or operation in addition to the orientation depicted in the drawings. For example, if a device in the figures is turned over, elements described as being on "lower" surfaces of other elements would then be oriented to be on "upper" surfaces of the other elements. Thus, the exemplary term "lower" can encompass both an orientation of upper and lower. Similarly, if a device in the figures is turned over, elements described as "below or beneath" other elements would then be oriented "above" the other elements. Thus, the exemplary term "below or beneath" can encompass both an orientation of above and below.

Hereinafter, a method of determining positions of assist features on a mask, that is, a method of arranging mask patterns, according to the present invention will be described.

Throughout the specification, one assist feature is mentioned for the convenience of explanation. However, the present invention is not limited thereto and a plurality of assist features may exist.

Figure 3:
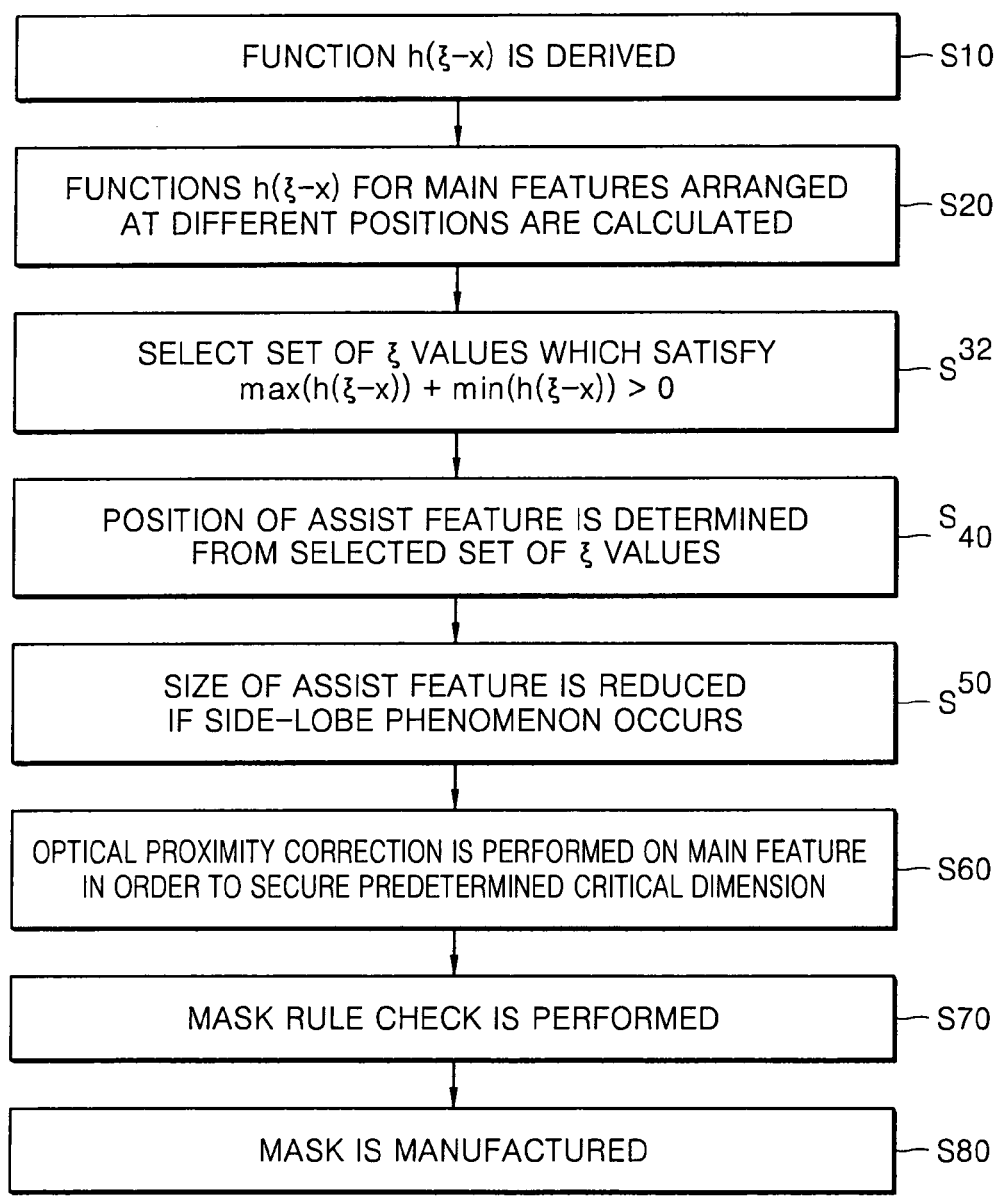

FIGS. 1 through 3 are flowcharts illustrating methods of arranging mask patterns, and in particular assist features within the mask patterns, according to embodiments of the present invention.

A process of deriving a function $h(\xi-x)$ (operation S10) will now be described where the image intensity $I(x)$ generated on a semiconductor wafer by a main feature on a mask may be approximated by Equation (1).

$$I(x) \cong e^2(x) = \left(e_0(x) + \sum_{\xi} \Delta e(x, \xi)\right)^2, \quad (1)$$

where x indicates a position of a main feature, $\xi$ indicates a position of an assist feature, $e_0(x)$ indicates contribution of the main feature to the image intensity $I(x)$, and $$\sum_{\xi} \Delta e(x, \xi)$$

indicates contribution of the assist feature to the image intensity $I(x)$. An increase or decrease in the contributions of the main feature and the assist feature leads to an increase or decrease in the image intensity $I(x)$.

Assuming that $m(\xi)$ is transmittance of the mask, the contribution of the assist feature may be given by Equation (2).

$$\Delta e(x, \xi) = h(\xi-x)m(\xi)\Delta\xi \quad (2)$$

Also, assuming that $I_0(x)$ is image intensity at the main feature when the assist feature does not exist, Equation 1 may be rearranged into Equations (3) through (5).

$$I_0 = e_0^2 \quad (3)$$

$$I = I_0 + \Delta I \quad (4)$$

$$\Delta I \cong 2e\Delta e \quad (5)$$

Equation (6) may also be obtained from Equations (3) through (5).

$$\Delta e = \frac{I - I_0}{2e} \cong \frac{I - I_0}{2e_0} = \frac{I - I_0}{2\sqrt{I_0}} \quad (6)$$

That is, the contribution of the assist feature can be represented by its relationship with the image intensity. The relationship between the h-function, which represents the contribution of the assist feature, and the image intensity is defined by Equation (7).

$$\frac{I(x) - I_0(x)}{2\sqrt{I_0(x)}} = h(\xi - x)m(\xi)\Delta\xi \quad (7)$$

Figure 4:
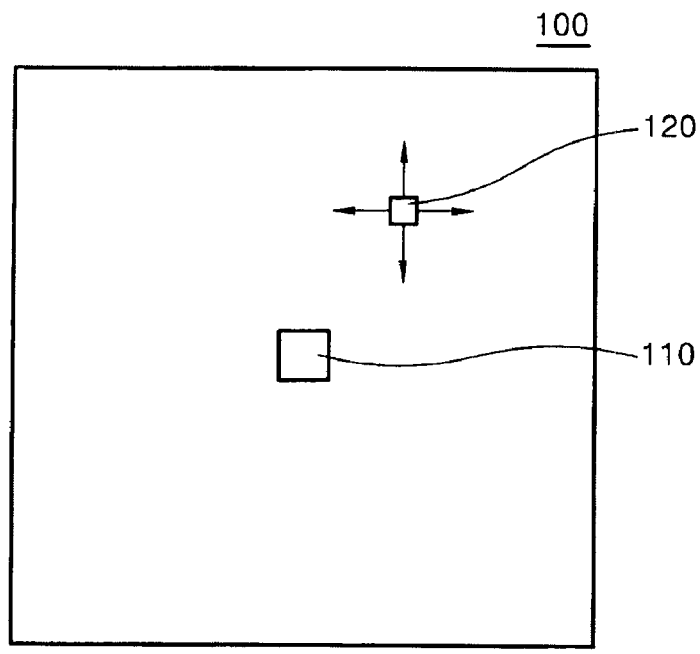
FIG. 4 is a plan view of a mask including a main feature and an assist feature for describing a process of deriving an h-function, according to an embodiment of the present invention.

FIG. 4 is a plan view of a mask including a main feature 110 and an assist feature 120 for describing a process of deriving an h-function, according to an embodiment of the present invention.

Referring to FIG. 4, a function $h(\xi-x)$ may be represented by image intensity at the main feature 110 and a mask transmittance of the assist feature 120 according to Equation (7). The function $h(\xi-x)$ is calculated while fixing the main feature 110 formed of a small, isolated portion onto the mask 100 and sweeping the small-sized assist feature 120 over the entire domain of the mask 100 as indicated by arrows in FIG. 4. A goal here is to calculate an h-function of $\xi-x$, i.e., the relative displacement between the main feature 110 and the assist feature 120.

According to Equation (2), the h-function is dependent on $\xi-x$, i.e., the relative position between the main feature 110 and the assist feature 120, but is not directly dependent on the position of the main feature 110. Therefore, once the h-function is calculated as described above and is stored in the form of a table, even when a plurality of main features exist, values of h-functions can be easily and quickly obtained using a look-up table method by applying the relative position $\xi-x$ between an assist feature to be reviewed and each of the main features to the table of the h-function calculated above.

Next, a process of calculating the h-functions of the main features arranged at different positions with respect to one assist feature (operation S20 of FIGS. 1 through 3) will now be described.

Figure 5:
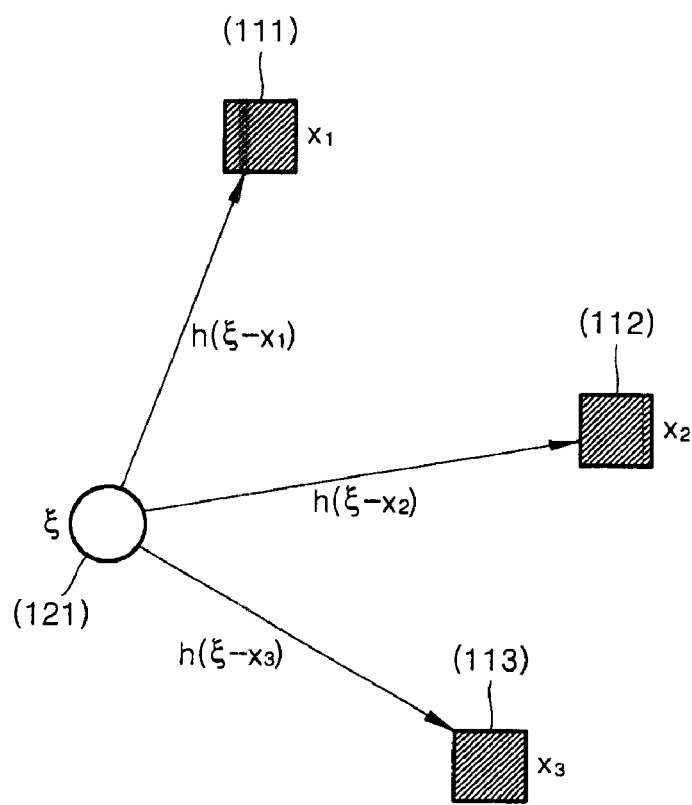
FIG. 5 is a view for describing a process of calculating h-functions of a plurality of main features arranged at different positions with respect to one assist feature, according to an embodiment of the present invention.

Referring to FIG. 5, a position of an assist feature 121 is fixed and functions $h(\xi-x)$ are respectively calculated for a plurality of main features 111, 112 and 113 with respect to the assist feature 121. That is, a function $h(\xi-x_1)$ for a position $x_1$ of the first main feature 11 can be obtained directly from the table of the h-function calculated in advance. In addition, a function $h(\xi-x_2)$ for a position $x_2$ of the second main feature 112 can be obtained directly from the table of the h-function calculated in advance. Also, a function $h(\xi-x_3)$ for a position $x_3$ of the third main feature 113 can be obtained directly from the table of the h-function calculated in advance. In this way, the respective functions $h(\xi-x)$ for all the main features at different positions on a mask can be quickly calculated.

As described above, the h-functions which represent the contribution of the assist feature with respect to the image intensity at the main features are calculated in operations S10 and S20 of FIGS. 1 through 3.

A method of determining the position of the assist feature using the h-function will now be described.

Referring to FIG. 1, the method of determining the position of the assist feature includes selecting a $\xi$ value which maximizes $$\sum_{x \in M} I(x)$$

(operation S30) and determining the position of the assist feature from a set of the selected $\xi$ (operation S40). Here, M indicates the entire domain of the mask. That is, the assist feature is arranged so as to enhance the image intensity of the entire mask.

Referring to Equation (1), assuming that the value satisfying:

$$\sum_{x \in M} I(x)$$

is equal to the value satisfying:

$$\sum_{x \in M} e(x, \xi),$$

Equation (8) has to be maximized.

$$\sum_{x \in M} \sum_{\xi} e(x, \xi) = \sum_{x \in M} \sum_{\xi} h(\xi - x) m(\xi) \Delta \xi \qquad (8)$$

Referring to FIG. 2, to select the set of $\xi$ values that maximizes Equation (8), Equation (9) has to be satisfied.

$$\sum_{x \in M} h(\xi - x) \geq T \geq 0 \qquad (9)$$

Thus, according to the embodiment of FIG. 2, the method of determining the position of the assist feature includes selecting a $\xi$ value which makes $$\sum_{x \in M} h(\xi - x)$$

equal to or greater than a first threshold value $T_1$ (operation S31) and determining the position of the assist feature from a set of $\xi$ values (operation S40). Here, M indicates the entire domain of the mask. The first threshold value $T_1$ may be set to zero such that the h-function can contribute to the image intensity I(x) as a positive value.

The embodiment of FIG. 2 is advantageous in that the position of the assist feature can be accurately determined. However, since the sum of the h-functions over the entire domain of the mask has to be calculated, a large amount of time may be required.

Accordingly, the position of the assist feature can be determined from a set of $\xi$ values which satisfy a condition that a linear combination of the maximum and the minimum of the function $h(\xi-x)$ is equal to or greater than a second threshold value $T_2$, without having to sum all the h-functions.

Referring to FIG. 3, the method of determining the position of the assist feature includes selecting a $\xi$ value which satisfies a condition that Equation (10) is equal to or greater than the second threshold value $T_2$ (operation S32) and determining the position of the assist feature from a set of $\xi$ values (operation S40).

$$A \cdot \max_{x \in M} h(\xi - x) + B \cdot \min_{x \in M} h(\xi - x), \qquad (10)$$

where M indicates the entire domain of the mask.

The second threshold value $T_2$ may be set to zero such that the h-function can contribute to the image intensity I(x) as a positive value. Also, A and B may be constants and are preferably 0.5. That is, the integral area of the h-function is simply calculated by averaging the maximum and the minimum.

As described above, the position of the assist feature may be determined using the h-function. The subsequent processes will continue to be described referring back to FIGS. 1 through 3.

After the position of the assist feature is determined (operation S40), a side lobe phenomenon may occur in which the assist feature is printed on a semiconductor wafer. This is obviously undesirable since the assist feature is not intended to be part of the final pattern transferred to the wafer and instead is intended solely to improve the accuracy of the main patterns finally formed on the wafer. However, it is possible in certain circumstances and because of the type of pattern that the assist pattern may sometimes be printed on the semiconductor wafer according. In this case, the size of the assist feature has to be reduced in order to prevent the assist feature from being printed on the semiconductor wafer (operation S50).

Also, after the position of the assist feature is determined (operation S40), an optical proximity correction (OPC) may be performed on the main features in order to implement a predetermined critical dimension on the semiconductor wafer (operation S60).

In addition, after the position of the assist feature is determined (operation S40), a mask rule check (MRC) may be performed in order to improve mask performance, that is, in order to accurately reproduce patterns implemented on the semiconductor wafer (operation S70).

Above operations S50 through S70 are performed after the position of the assist feature is determined (operation S40). In modified embodiments of the present invention, operations S50 through S70 illustrated in FIGS. 1 through 3 may be performed in different orders, and some of the operations S50 through S70 may be omitted.

Mask patterns arranged by performing operations S10 through S70 are then implemented on the mask by a subsequent manufacturing process (operation S80).

By applying the method described above to fabricate semiconductor devices, depth of focus (DOF) of the semiconductor devices is kept uniform and a contact critical dimension is reduced 18% from 140 nm to 115 nm. That is, mask patterns can be implemented more precisely without a loss of DOF.

The above method of arranging the mask patterns suggests a systematic and general method of arranging an assist feature so as to reach a stable result regardless of the shape and arrangement of a main feature so that the position of the assist feature can be automatically determined.

Figure 6:
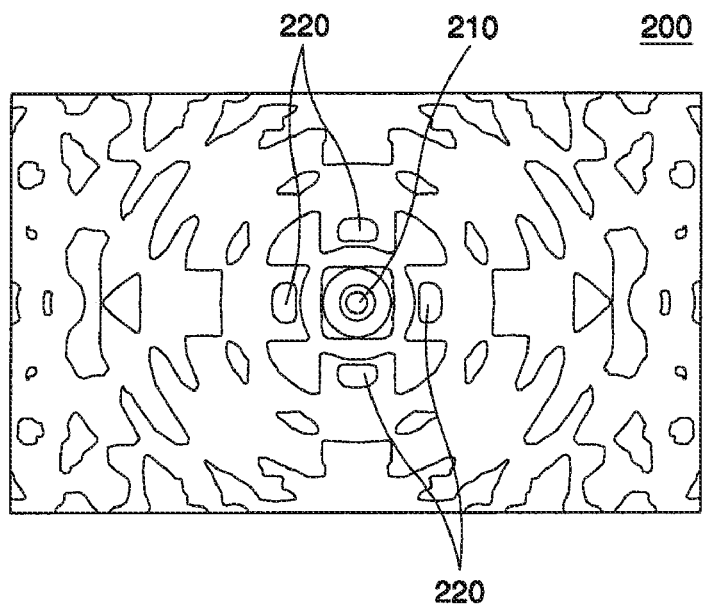
FIG. 6 illustrates a simulation showing the amplitude of an image implemented on a semiconductor wafer according to an embodiment of the present invention.

FIG. 6 illustrates a simulation showing the amplitude of an image implemented on a semiconductor wafer according to an embodiment of the present invention.

Referring to FIG. 6, the amplitude of features within the image are shown with contour lines, but are typically shown within a computer simulation display as color-coded so that the brighter the color of a region of an image implemented on a semiconductor wafer, the higher the amplitude of the image. If a target pattern independently exists at the center of the image, a main feature may be arranged at the center region 210 of the image and a position of an assist feature may be determined to be located at neighboring regions 220 around the center region 210, according to an embodiment of the present invention. However, when the target pattern exists independently as described above, the position of the assist feature may also be determined easily using a conventional method.

Figure 7A:
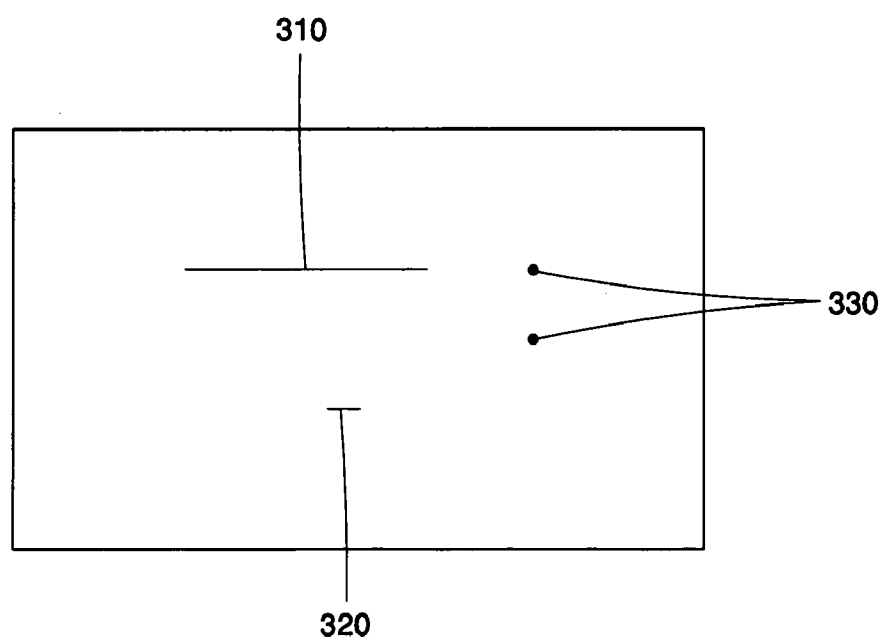
FIG. 7A is a plan view of target patterns to be implemented according to an embodiment of the present invention.
Figure 7B:
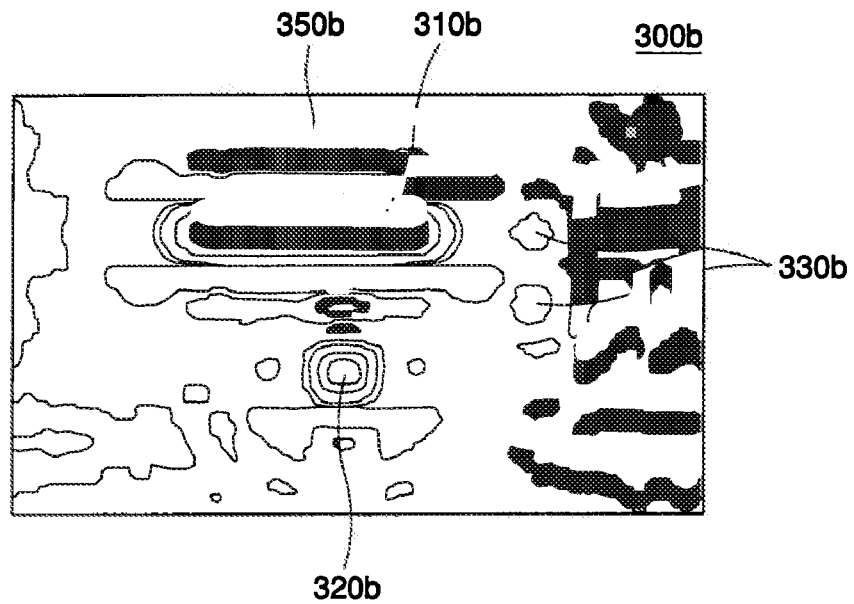
FIG. 7B illustrates the amplitude of the target patterns of FIG. 7A implemented in a simulation on a semiconductor wafer using a conventional method.
Figure 7C:
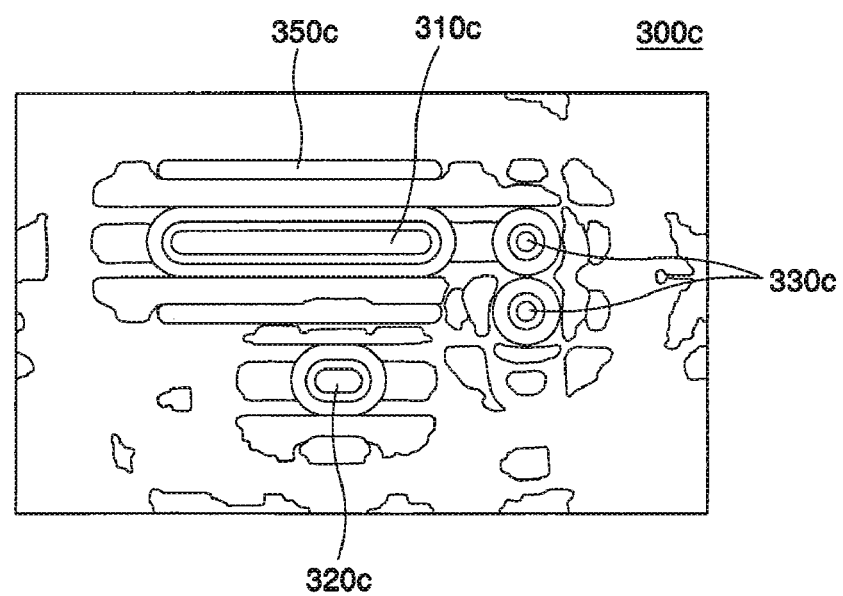
FIG. 7C illustrates the amplitude of an image implemented in a simulation on a semiconductor wafer according to an embodiment of the present invention.

FIG. 7A is a plan view of target patterns to be implemented according to an embodiment of the present invention. FIG. 7B illustrates a simulation showing the amplitude of the target patterns of FIG. 7A implemented on a semiconductor wafer using a conventional method. FIG. 7C illustrates a simulation showing the amplitude of an image implemented on a semiconductor wafer according to an embodiment of the present invention. As shown, the features formed using the invention are more sharply and accurately defined on the wafer.

Referring to FIG. 7A, the target patterns include a long-lined target pattern 310, a short-lined target pattern 320 and a dotted target pattern 330.

Referring to FIG. 7B, in the target patterns implemented using the conventional method, the assist feature can be arranged in regions, such as elongate region 350b positioned above feature 310b. In this case, lined target patterns 310b and 320b are implemented on a semiconductor wafer. However, a dotted target pattern 330b is not implemented (e.g. not clearly defined) on the semiconductor wafer.

Referring to FIG. 7C, in the target patterns implemented according to an embodiment of the present invention, the assist feature can be arranged in regions such as more sharply defined elongate region 350c positioned above the feature 310c. In this case, lined target patterns 310c and 320c are implemented on a semiconductor wafer. Furthermore, a dotted target pattern 330c is also implemented on the semiconductor wafer, being much more clearly defined that resulting pattern 330b in FIG. 7B.

Accordingly, when a semiconductor wafer has a plurality of target patterns which influence each other (rather than a single, independent target pattern), the target patterns can be accurately implemented on the semiconductor wafer using a method of arranging mask patterns according to an embodiment of the present invention.

A computer readable recording medium having recorded thereon a computer program will now be described, where the computer program is adapted to execute a method of determining an optimal position of an assist feature.

Software functionalities of a computer system involve programming, including executable code, may be used to implement the above described method of determining an optimal position of an assist feature of a mask. Since the method is described above, a detailed description thereof will be omitted here. The software code is executable by a general-purpose computer. In operation, the code and possibly the associated data records are stored within a general-purpose computer platform. At other times, however, the software may be stored at other locations and/or transported for loading into appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions in essentially the manner as performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Next, a mask will now be described that includes an assist feature placed at an optimal position.

The mask includes main and assist features. The position of the assist feature is determined using an h-function which represents a contribution of the assist feature with respect to image intensity at the main feature. The h-function can be obtained by Equation (7).

In addition, the h-function may be calculated for each of a plurality of main features arranged at different positions on the mask. Since the determination of an optimal position of the assist feature is described above, a detailed description thereof will be omitted. An OPC may be performed on the main feature in order to implement a predetermined critical dimension.

According to a method of arranging mask patterns and an apparatus using the method, a position of an assist feature can be properly and quickly determined in accordance with shape and arrangement of a main feature.

While the present invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method of arranging mask patterns on a semiconductor wafer, the method comprising:
    deriving in a first process an h-function which represents a contribution of an assist feature with respect to image intensity at a main feature;
    determining in a second process a position of the assist feature using the h-function; and
    arranging a mask pattern on the semiconductor wafer, using a computer system, according to the determining step,
    wherein the h-function is determined by:

$$\frac{I(x) - I_0(x)}{2\sqrt{I_0(x)}} = h(\xi - x) m(\xi) \Delta \xi,$$

where x indicates the position of the main feature, $\xi$ indicates the position of the assist feature, I(x) indicates image intensity at the main feature when the assist feature exists, $I_o(x)$ indicates image intensity at the main feature when the assist feature does not exist, and $m(\xi)$ indicates transmittance of a mask,
    wherein the method further comprises deriving in the first process the h-function for each of a plurality of main features arranged at different positions on the mask, and
    wherein the method further comprises determining in the second process the position of the assist feature from a set of $\xi$ values which makes the value satisfying $$\sum_{x \in M} h(\xi - x)$$

equal to or greater than a predetermined threshold value, where M indicates the entire domain of the mask.

2. The method of claim 1, wherein the method further comprises determining in the second process the position of the assist feature from a set of $\xi$ values which maximize $$\sum_{x \in M} I(x),$$

where M indicates the entire domain of the mask.

3. The method of claim 1, wherein the predetermined threshold value is zero.

4. The method of claim 1, wherein the method further comprises determining in the second process the position of the assist feature from a set of $\xi$ values where $$A \cdot \max_{x \in M} h(\xi - x) + B \cdot \min_{x \in M} h(\xi - x)$$

is equal to or greater than a predetermined threshold value, that is, a linear combination of the maximum and the minimum of the function h($\xi$–x) is equal to or greater than the predetermined threshold value, where A and B are constants and M indicates the entire domain of the mask.

5. The method of claim 4, wherein each of A and B is 0.5 and the predetermined threshold value is zero.

6. The method of claim 1, further comprising reducing in a third process the size of the assist feature after the second process, if a side lobe phenomenon occurs in which the assist feature is printed on a semiconductor wafer.

7. The method of claim 1, further comprising performing in a fourth process an optical proximity correction (OPC) to the main feature after the second process in order to implement a predetermined critical dimension.

8. The method of claim 1, further comprising performing in a fifth process a mask rule check after the second process in order to enhance the performance of the mask.

9. A non-transitory computer readable recording medium having recorded thereon a computer program for executing a method for arranging mask patterns, the computer program comprising:
    a first process programmed to obtain an h-function that represents a contribution of an assist feature with respect to image intensity at a main feature; and
    a second process programmed to determine the position of the assist feature using the h function,
    wherein the h function is determined by:

$$\frac{I(x) - I_0(x)}{2\sqrt{I_0(x)}} = h(\xi - x) m(\xi) \Delta \xi,$$

where x indicates the position of the main feature, $\xi$ indicates the position of the assist feature, I(x) indicates image intensity at the main feature when the assist feature exists $I_0(x)$ indicates image intensity at the main feature when the assist feature does not exist, and $m(\xi)$ indicates transmittance of a mask,
    wherein the first process is further programmed to obtain the h-function for each of a plurality of main features arranged at different positions on the mask, and
    wherein the second process is further programmed to determine the position of the assist feature from a set of $\xi$ values which makes the value satisfying $$\sum_{x \in M} h(\xi - x)$$

equal to or greater than a predetermined threshold value, where M indicates the entire domain of the mask.

10. The computer readable recording medium of claim 9, wherein the second process is further programmed to determine the position of the assist feature from a set of $\xi$ values which maximize $$\sum_{x \in M} I(x),$$

where M indicates the entire domain of the mask.

11. The computer readable recording medium of claim 9, wherein the predetermined threshold value is zero.

12. The computer readable recording medium of claim 9, wherein the second process is further programmed to determine the position of the assist feature from a set of $\xi$ values where $$A \cdot \max_{x \in M} h(\xi - x) + B \cdot \min_{x \in M} h(\xi - x)$$

is equal to or greater than a predetermined threshold value, that is, where a linear combination of the maximum and the minimum of the function $h(\xi-x)$ is equal to or greater than the predetermined threshold value, where A and B are constants and M indicates the entire domain of the mask.

13. The computer readable recording medium of claim 12, wherein each of A and B is 0.5 and the predetermined threshold value is zero.

14. The computer readable recording medium of claim 9, wherein the medium further comprises a third process programmed to reduce the size of the assist feature after the second process, if a side lobe phenomenon in which the assist feature is printed on a semiconductor wafer occurs.

15. The computer readable recording medium of claim 9, wherein the medium further comprises a fourth process programmed to perform an OPC to the main feature after the second process in order to implement a predetermined critical dimension.

16. The computer readable recording medium of claim 9, wherein h medium further comprises a fifth process programmed to perform a mask rule check after the second process in order to enhance the performance of the mask.

17. A mask for a semiconductor wafer, the mask comprising:
a main feature; and
an assist feature at a position on the mask determined using an h-function which represents the contribution of the assist feature with respect to image intensity at the main feature,
wherein the h-function is determined by $$\frac{I(x) - I_0(x)}{2\sqrt{I_0(x)}} = h(\xi - x) m(\xi) \Delta \xi,$$

where x indicates the position of the main feature, $\xi$ indicates the position of the assist feature, $I(x)$ indicates image intensity at the main feature when the assist feature exists $I_0(x)$ indicates image intensity at the main feature when the assist feature does not exist, and $m(\xi)$ indicates transmittance of a mask,
wherein the mask further comprises a plurality of main features arranged at different positions on the mask, using a computer system, and at least one assist feature located at a position determined by the h-function for each of the plurality of main features, and
wherein the position of the at least one assist features is determined from a set of $\xi$ values which makes the value satisfying $$\sum_{x \in M} h(\xi - x)$$

equal to or greater than a predetermined threshold value, where M indicates the entire domain of the mask.

18. The mask of claim 17, wherein the position of the at least one assist features is determined from a set of $\xi$ values which maximize $$\sum_{x \in M} I(x),$$

where M indicates the entire domain of the mask.

19. The mask of claim 17, wherein the predetermined threshold value is zero.

20. The mask of claim 17, wherein the position of the at least one assist features is determined from a set of $\xi$ values where $$A \cdot \max_{x \in M} h(\xi - x) + B \cdot \min_{x \in M} h(\xi - x)$$

is equal to or greater than a predetermined threshold value, that is, where a linear combination of the maximum and the minimum of the function $h(\xi-x)$ is equal to or greater than the predetermined threshold value, and where A and B are constants and M indicates the entire domain of the mask.

21. The mask of claim 20, wherein each of A and B is 0.5 and the predetermined threshold value is zero.

22. The mask of claim 17, wherein the assist feature is formed on the mask with a reduced size if a side-lobe phenomenon occurs.

* * * * *